(12) United States Patent
Redinger

(10) Patent No.: US 11,946,891 B2
(45) Date of Patent: *Apr. 2, 2024

(54) TEMPERATURE-CORRECTED CONTROL DATA FOR VERIFYING OF STRUCTURAL INTEGRITY OF MATERIALS

(71) Applicant: 3M INNOVATIVE PROPERTIES COMPANY, St. Paul, MN (US)

(72) Inventor: David H. Redinger, Afton, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 141 days.

This patent is subject to a terminal disclaimer.

(21) Appl. No.: 17/302,034

(22) Filed: Apr. 22, 2021

(65) Prior Publication Data

US 2021/0239640 A1 Aug. 5, 2021

Related U.S. Application Data

(63) Continuation of application No. 16/641,692, filed as application No. PCT/IB2018/056461 on Aug. 24, 2018, now Pat. No. 11,016,047.

(60) Provisional application No. 62/550,083, filed on Aug. 25, 2017.

(51) Int. Cl.
| | | |
|---|---|---|
| G01N 27/20 | (2006.01) | |
| G01N 27/02 | (2006.01) | |
| G01N 27/24 | (2006.01) | |
| G01N 27/72 | (2006.01) | |
| G01N 27/82 | (2006.01) | |
| G01N 27/90 | (2021.01) | |
| G01N 27/9013 | (2021.01) | |
| G01N 27/904 | (2021.01) | |
| G01R 31/28 | (2006.01) | |
| G01R 35/00 | (2006.01) | |
| G05B 19/4099 | (2006.01) | |

(52) U.S. Cl.
CPC ............. *G01N 27/20* (2013.01); *G01N 27/02* (2013.01); *G01N 27/023* (2013.01); *G01N 27/24* (2013.01); *G01N 27/72* (2013.01); *G01N 27/82* (2013.01); *G01N 27/90* (2013.01); *G01N 27/902* (2013.01); *G01N 27/904* (2013.01); *G01N 27/9046* (2013.01); *G01R 31/2817* (2013.01); *G01R 35/007* (2013.01); *G05B 19/4099* (2013.01)

(58) Field of Classification Search
None
See application file for complete search history.

(56) References Cited

U.S. PATENT DOCUMENTS

| | | |
|---|---|---|
| 3,566,204 A | 2/1971 | Callahan |
| 4,583,038 A | 4/1986 | Chittick |
| 4,656,595 A | 4/1987 | Hognestad |

(Continued)

FOREIGN PATENT DOCUMENTS

| | | | | |
|---|---|---|---|---|
| JP | H05-288706 | | 11/1993 | |
| KR | 2014129668 A | * | 11/2014 | .......... G01M 5/0016 |
| WO | WO2019038733 A1 | | 2/2019 | |

OTHER PUBLICATIONS

PCT International Search Report from PCT/IB2018/056461, dated Dec. 12, 2018, 6 pages.

*Primary Examiner* — Kyle R Quigley
*Assistant Examiner* — Leonard S Liang
(74) *Attorney, Agent, or Firm* — Sriram Srinivasan

(57) ABSTRACT

The disclosure describes techniques for detecting a crack or defect in a material.

12 Claims, 7 Drawing Sheets

(56) References Cited

U.S. PATENT DOCUMENTS

| | | |
|---|---|---|
| 4,677,855 A | 7/1987 | Coffin, Jr. |
| 4,683,419 A | 7/1987 | Neuelmann |
| 4,914,378 A | 4/1990 | Hayashi |
| 4,924,708 A | 5/1990 | Solomon |
| 5,485,084 A | 1/1996 | Duncan |
| 5,486,767 A | 1/1996 | Schwabe |
| 6,188,218 B1 | 2/2001 | Goldfine |
| 6,476,624 B1 | 11/2002 | Chuman et al. |
| 6,657,429 B1 | 12/2003 | Goldfine |
| 7,095,224 B2 | 8/2006 | Goldfine |
| 7,162,384 B1 | 1/2007 | Browning |
| 7,239,977 B2 | 7/2007 | Fantana |
| 7,519,487 B2 | 4/2009 | Saguy |
| 7,590,507 B2 | 9/2009 | Chang |
| 8,013,600 B1 | 9/2011 | Yepez |
| 10,444,189 B2 | 10/2019 | Goldfine |
| 11,016,047 B2 * | 5/2021 | Redinger ................ G01N 27/20 |
| 2003/0101006 A1 * | 5/2003 | Mansky ................ G01N 25/18 |
| | | 702/30 |
| 2004/0174157 A1 * | 9/2004 | Goldfine .............. G01N 27/904 |
| | | 700/110 |
| 2004/0225474 A1 | 11/2004 | Goldfine |
| 2005/0075800 A1 | 4/2005 | Batzinger |
| 2005/0127908 A1 | 6/2005 | Schlicker |
| 2005/0171703 A1 * | 8/2005 | Goldfine ............ G01N 27/9013 |
| | | 702/30 |
| 2005/0278597 A1 * | 12/2005 | Miguelanez ....... G05B 23/0229 |
| | | 714/E11.17 |
| 2006/0009865 A1 * | 1/2006 | Goldfine ................ G05D 23/26 |
| | | 700/29 |
| 2007/0166831 A1 | 7/2007 | Watkins, Jr. |
| 2009/0001974 A1 | 1/2009 | Sheiretov |
| 2010/0163433 A1 | 7/2010 | Horn |
| 2010/0207651 A1 | 8/2010 | Suto |
| 2011/0001498 A1 | 1/2011 | Espejord |
| 2012/0072143 A1 * | 3/2012 | Yogeeswaran ....... G01R 35/007 |
| | | 702/85 |
| 2013/0069663 A1 | 3/2013 | Gottrnann |
| 2013/0134992 A1 | 5/2013 | Zhu |
| 2016/0077027 A1 | 3/2016 | Sweers |
| 2016/0216318 A1 | 7/2016 | Zhang |
| 2016/0274060 A1 * | 9/2016 | Denenberg ............. G01R 27/02 |
| 2017/0269017 A1 | 9/2017 | Klein |
| 2019/0323980 A1 | 10/2019 | Yungers |
| 2019/0346393 A1 | 11/2019 | Chinnock |
| 2019/0346394 A1 | 11/2019 | Redinger |
| 2019/0346395 A1 | 11/2019 | Redinger |
| 2019/0346396 A1 | 11/2019 | Redinger |
| 2019/0383763 A1 | 12/2019 | Yungers |
| 2020/0011826 A1 | 1/2020 | Yungers |
| 2020/0116661 A1 | 4/2020 | Yungers |

\* cited by examiner

TEMPERATURE-CORRECTED CONTROL DATA FOR VERIFYING OF STRUCTURAL INTEGRITY OF MATERIALS

CROSS REFERENCE TO RELATED APPLICATIONS

This application is a Continuation of U.S. patent application Ser. No. 16/641,692, filed 25 Feb. 2020, now granted U.S. Pat. No. 11,016,047 B2, which is a U.S. 371 Application based on PCT/IB2018/056461, filed 24 Aug. 2018, which claims the benefit of Provisional U.S. Patent Application No. 62/550,083, filed 25 Aug. 2017, the entire disclosure of each of which is incorporated herein by reference.

TECHNICAL FIELD

The disclosure relates to techniques for verifying structural integrity of conductive or semiconductive materials.

BACKGROUND

Many materials are useful when their mechanical properties remain intact, but less useful when damaged, such as when cracked. Thus, detection whether these materials are damaged is important. As one example, ceramic body plating is used to protect soldiers, police officers, and other security personnel from projectiles. Ceramic body plating may be useful when undamaged, but may be replaced after being damaged, e.g., after cracking.

X-ray scanning, including X-ray radiography and X-ray computed tomography (CT scanning) may be used to detect cracks or other defects in materials. However, such techniques may utilize large and heavy scanners, which may not be easily portable. Further, X-ray scanning and X-ray CT scanning may be relatively expensive, relatively slow, or both.

SUMMARY

In general, this disclosure describes systems and techniques for verifying structural integrity of a tested material. In the disclosed techniques, a computing device may determine whether a tested material includes a crack or other defect based on a temperature-scaled control data set and a measurement data set. The temperature-scaled control data set may be based on a first control data set associated with a first control temperature, a second control data set associated with a second control temperature, and a measurement temperature associated with the measurement data set. For example, the temperature-scaled control data set may be determined using a weighted sum of the first control data set and the second control data set based on a scaling factor. The scaling factor may be determined using a linear combination or a polynomial combination based on the measurement temperature, the first control temperature, and the second control temperature. In some examples, the computing device may determine the weighted sum to determine the temperature-scaled control data set. In other examples, the computing device may retrieve the temperature-scaled control data set from a memory associated with the computing device. The memory may store a plurality of temperature-scaled control data sets, each temperature-scaled control data set of the plurality of temperature-scaled control data sets associated with a respective temperature. By utilizing a temperature-scaled control data set, the computing device may compensate for effects of temperature on the control data set and the measurement data set, e.g., due to changes of electrical conductivity as a function of temperature, and differences in temperature between the measurement data set and the control data set. In some examples, the tested material may include multiple layers, each layer including a different material. The different materials may electrical conductivities that change differently as a function of temperature, which may lead to complex changes in conductivity of the material as a whole as a function of temperature. Utilizing a temperature-scaled control data set may compensate for this complex behavior.

In some examples, the disclosure describes a method that includes determining, by a computing device, a temperature-scaled control data set based on a measurement temperature associated with a measurement data set. The measurement data set may be associated with a tested material and may include a plurality of values representative of electrical parameters of the tested material. The method also may include generating, by the computing device, comparisons of respective values of the measurement data set to corresponding respective values of the temperature-scaled control data set. The method further may include determining, by the computing device, whether the tested material includes a crack or defect based on the comparisons.

In some examples, the disclosure describes a system that includes a computing device. The computing device may be configured to determine a temperature-scaled control data set based on a measurement temperature associated with a measurement data set. The measurement data set may be associated with a tested material and may include a plurality of values representative of electrical parameters of the tested material. The computing device also may be configured to generate comparisons of respective values of the measurement data set to corresponding respective values of the temperature-scaled control data set. The computing device may be further configured to determine whether the tested material includes a crack or defect based on the comparisons.

In some examples, the disclosure describes a computer readable storage medium including instructions that, when executed, cause a computing device to determine a temperature-scaled control data set based on a measurement temperature associated with a measurement data set. The measurement data set may be associated with a tested material and may include a plurality of values representative of electrical parameters of the tested material. The computer readable storage medium may also include instructions that, when executed, cause the computing device to generate comparisons of respective values of the measurement data set to corresponding respective values of the temperature-scaled control data set. The computer readable storage medium may further include instructions that, when executed, cause the computing device to determine whether the tested material includes a crack or defect based on the comparisons.

The techniques described herein may provide one or more advantages. For example, the techniques may facilitate determination of whether a tested material includes a crack or other defect in spite of changes in temperature of the tested material between an initial measurement time at which the control data set is collected and a later time at which the measurement data set is collected. The techniques may compensate for effects of temperature changes even when the tested material includes multiple regions of different materials with different temperature behavior. Further, the techniques described herein may be relatively computationally inexpensive, thus being able to be performed using relatively less powerful computing devices. As another example, a crack detection system as described herein may offer improved portability and cost compared to an X-ray radiography or X-ray computed tomography system, while offering sufficient accuracy and detail to enable detection of cracks or other defects in a tested material being used in the field.

The details of one or more examples are set forth in the accompanying drawings and the description below. Other features, objects, and advantages will be apparent from the description and drawings, and from the claims.

DETAILED DESCRIPTION

Figure 1:
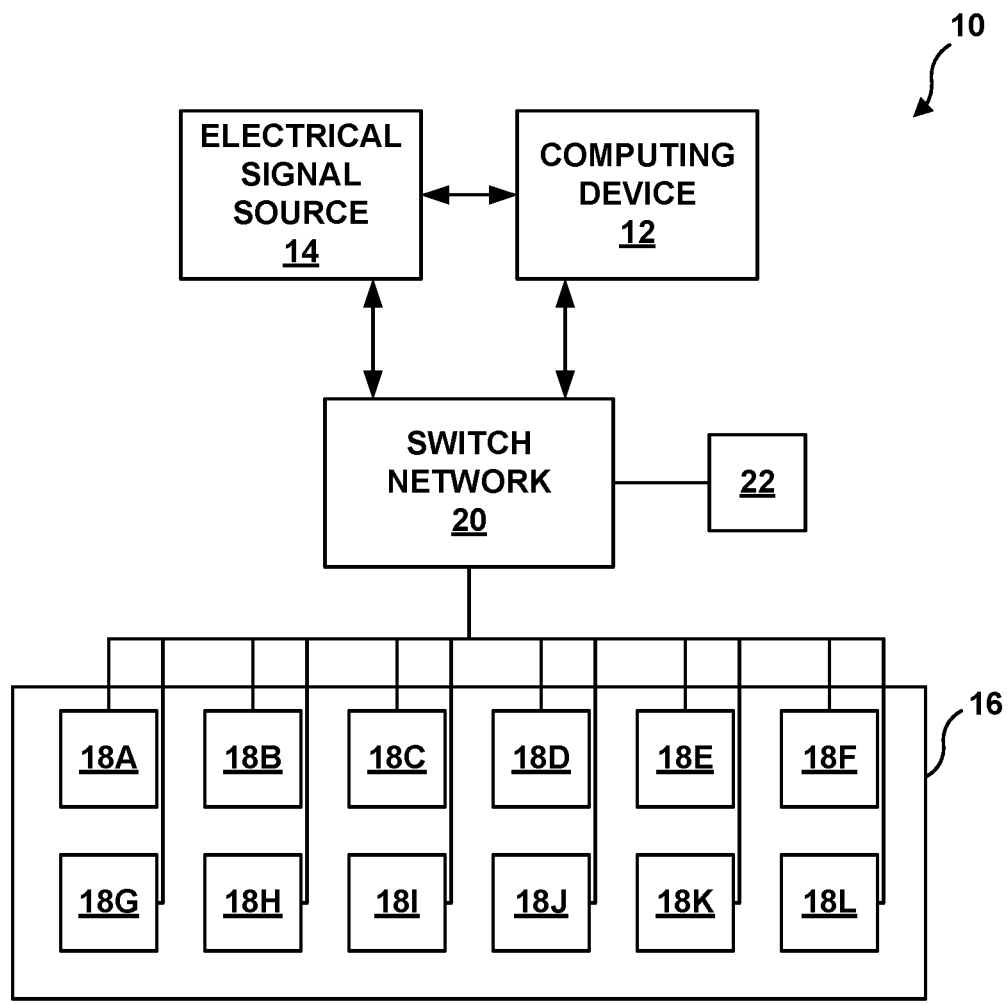
FIG. 1 is a conceptual and schematic block diagram illustrating an example system for determining whether a material includes a crack or other defect using a temperature-scaled control data set.

In general, this disclosure describes systems and techniques for verifying structural integrity of a tested material. In the disclosed techniques, a computing device may determine whether a tested material includes a crack or other defect based on a temperature-scaled control data set and a measurement data set. The temperature-scaled control data set may be based on a first control data set associated with a first control temperature, a second control data set associated with a second control temperature, and a measurement temperature associated with the measurement data set. For example, the temperature-scaled control data set may be determined using a weighted sum of the first control data set and the second control data set based on a scaling factor. The scaling factor may be determined using a linear combination or a polynomial combination based on the measurement temperature, the first control temperature, and the second control temperature. In some examples, the computing device may determine the weighted sum to determine the temperature-scaled control data set. In other examples, the computing device may retrieve the temperature-scaled control data set from a memory associated with the computing device. The memory may store a plurality of temperature-scaled control data sets, each temperature-scaled control data set of the plurality of temperature-scaled control data sets associated with a respective temperature.

By utilizing a temperature-scaled control data set, the computing device may compensate for effects of temperature on the control data set and the measurement data set, e.g., due to changes of electrical conductivity as a function of temperature, and differences between the measurement temperature and the control temperatures associated with the control data sets. In some examples, the tested material may include multiple layers, each layer including a different material. The different materials may have electrical conductivities that change differently as a function of temperature, which may lead to complex changes in conductivity of the material as a whole as a function of temperature. Utilizing a temperature-scaled control data set may compensate for this complex behavior.

In some examples, the control data sets may be determined for the same tested material when the tested material is known to be intact (undamaged), the control voltage may be determined using a model of the tested material in an intact (undamaged) state, or the control voltage may be determined as an average (e.g., mean) of a plurality of similar materials (e.g., in geometry and composition) that are known to be intact (undamaged). Each control data set may include a plurality of control electrical parameter values, and each respective control electrical parameter value may be associated with a combination of a drive electrical contact and measurement electrical contact.

In some examples, the computing device may acquire the measurement data set. For example, the computing device may cause an electrical signal source to output an electrical signal to at least one drive electrical contact and may determine a respective electrical parameter associated with each of a plurality of measurement electrical contacts. The electrical signal may be a voltage signal or a current signal, and the measured electrical parameter may be, for example, a voltage, and impedance, or the like. The voltage may include a complex voltage, only a real portion of a voltage, or only a reactive portion of the voltage. In some implementations, the computing device may cause the electrical signal source to output respective electrical signals to a plurality of drive electrical contacts, e.g., in sequence. For each drive electrical contact, the computing device may determine a respective electrical parameter associated with each of a plurality of measurement electrical contacts. As another example, the computing device may cause an electrical signal source to output an electrical signal to at least one inductor and may determine a respective electrical parameter associated with each of a plurality of measurement electrical contacts. The computing device also may determine a temperature of the tested material or an environment in which the tested material is disposed during the measurement process. The measurement data set may include a plurality of values of the electrical parameter, each respective value of the electrical parameter being associated with a combination of a drive electrical contact (or inductor) and measurement electrical contact.

Other techniques also may be used to detect cracks in a material. For example, X-ray radiography or X-ray computed tomography (CT) may be used to detect cracks in a material. However, X-ray radiography and X-ray CT utilize relatively large, relatively expensive equipment to perform the crack detection. This may prevent X-ray radiography and X-ray CT from being portable, such as being used to test materials in the environments in which they are used. Moreover, X-ray radiography and X-ray CT may be relatively time consuming.

In contrast, an electrical parameter measurement utilizes relatively smaller, relatively less expensive equipment. As such, the equipment may enable portable crack detection systems, which may be used to detect cracks in materials in situ rather than requiring removing the materials to be tested to the testing equipment.

FIG. 1 is conceptual and schematic diagram block illustrating an example system 10 for determining presence of a crack or other defect in a tested material 16 using a temperature-scaled control data set. The system 10 of FIG. 1 includes a computing device 12, and optionally includes an electrical signal source 14, a plurality of electrical contacts 18A-18L (collectively, "electrical contacts 18"), a switch network 20, and a reference electrical contact 22. Electrical contacts 18 are electrically coupled to tested material 16, which is being tested using a four-point voltage measurement.

Tested material 16 may be any material for which detection of a potential crack or other defect is desired. In some examples, tested material 16 may be an electrically conductive or an electrically semiconductive material. For example, tested material 16 may include a metal, an alloy, a metalloid, a semiconductor, an electrically conductive or semiconductive ceramic, or the like. In some examples, tested material 16 may include a ceramic such as boron carbide ($B_4C$), silicon carbide (SiC), alumina ($Al_2O_3$), composites thereof, or the like.

Tested material 16 may be used in any one of a wide variety of applications. For example, material 16 may be a ceramic that has relatively high hardness, a relatively high Young's modulus, a relatively high tensile strength, and may be used in ceramic armor plating. Ceramic armor plating may be used in body armor for military and police personnel, vehicle armor, or the like. Example materials for ceramic armor plating include boron carbide ($B_4C$), silicon carbide (SiC), alumina ($Al_2O_3$), composites thereof, or the like.

Tested material 16 may define any geometry, and the geometry of material 16 may be based at least in part on the intended use for tested material 16. For example, ceramic armor plating may have a geometry defined by the surface that the armor plating will be applied to. Example geometries for tested material 16 include, but are not limited to, polygonal solids, such as rectangular solids or solids with more sides.

Figure 2:
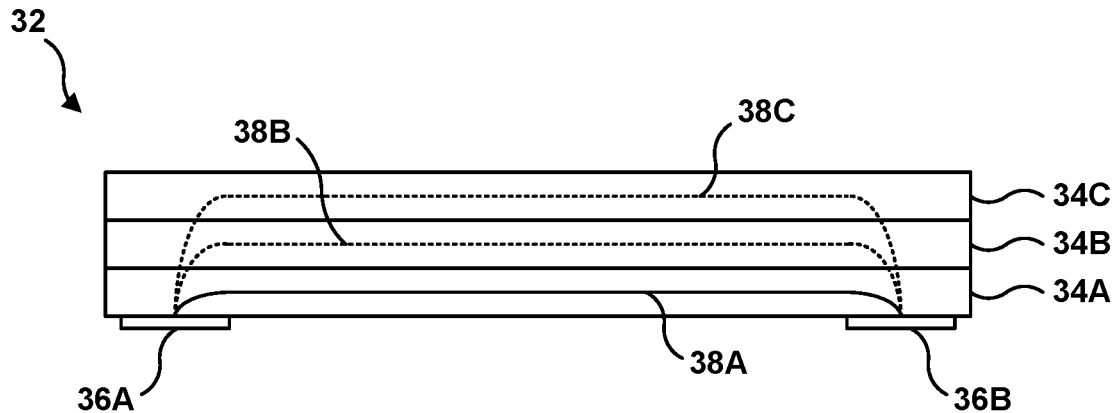
FIG. 2 is a conceptual diagram illustrating an example of a tested material including multiple layers.

In some examples, tested material 16 may include a plurality of layers, and at least one layer of the plurality of layers may include a different composition than another layer of the plurality of layers. FIG. 2 is a conceptual diagram illustrating an example of a tested material 32 including multiple layers 34A, 34B, 34C (collectively, "layers 34"). For example, a first layer 34A may include a ceramic, a second layer 34B may include a polymer, such as an adhesive, and a third layer 34C may include a woven or non-woven material, a fourth layer may be a metal or other conductive material, or the like. The layers 34 may contribute to mechanical properties of tested material 16.

In some examples, layers 34 may be in electrical contact with each other, such that at least part of a current injected into first layer 34A via a first electrical contact 36A may conduct through one or more other layers 34B or 34C to second electrical contact 36B. For example, as shown in FIG. 2, a first portion 38A of current flows through first layer 34A, a second portion 38B of current flows through second layer 34B, and a third portion 38C of current flows through third layer 34C. Portions 38B and 38C may be considered leakage current when electrical behavior of first layer 34A is being tested. As the different layers 34 may have different compositions, the different layers 34 also may have different temperature coefficients for electrical conductivity. This may result in the leakage current changing as temperature of tested material 32 changes. Further, electrical contact between the layers 34 may vary with position in tested material 32, which also may contribute to changes in leakage paths based on position within tested material 32. Together, the variation of electrical contact with position in tested material 32 and temperature of tested material 32 may contribute to difficulty in isolating changes in electrical conductivity of a particular layer of tested material 32 when tested material 32 includes multiple layers 34.

Returning to FIG. 1, optional electrical signal source 14 may include any device configured to output an electrical signal to electrical contacts 18. The electrical signal may include an alternating current (AC) signal or a direct current (DC) signal. In some examples, electrical signal source 14 may output a current signal; in other examples, electrical signal source 14 may output a voltage signal. In some examples, electrical signal source 14 may include a power source, such as a battery, a capacitor, a supercapacitor, a transformer electrically connected to a mains voltage, or the like. In addition to the power source, electrical signal source 14 may include analog or digital circuitry configured to receive the electrical signal from the power source and modify the electrical signal into a format suitable for output to electrical contacts 18.

Optional switch network 20 includes a plurality of inputs and a plurality of outputs, with respective inputs electrically coupled to each respective output by the network of switches. For example, switch network 20 may include a pair of inputs electrically coupled to electrical signal source 14, and at least a pair of inputs electrically coupled to computing device 32. Switch network 20 may include at least as many outputs are there are electrical contacts 18 and 22. For example, in the example shown in FIG. 1, system 10 includes thirteen electrical contacts, and switch network 20 thus includes at least thirteen outputs. Each electrical contact of electrical contacts 18 and reference electrical contact 22 is electrically coupled to a respective output of switch network 20.

Optional electrical contacts 18 include a plurality of electrical contacts electrically coupled to tested material 16. In some examples, as shown in FIG. 1, each electrical contact of electrical contacts 18 is also electrically coupled to switch network 20. Each of electrical contacts 18 may be electrically connected to tested material 16 using any suitable type of electrical coupling, including, for example, an electrically conductive adhesive, an electrically conductive solder, embedding electrical contacts 18 in tested material 16, a dielectric coupling via capacitive coupling, or the like.

Electrical contacts 18 may be attached to any surface of tested material 16. The surface to which electrical contacts 18 are attached may affect the direction in which the electrical field extends and current flows within tested material 16. Cracks or other defects may affect the magnitude of the voltage more significantly when the electrical field and current flow extends across a plane of the crack (e.g., normal to a surface of the crack). As such, in some examples, the likely locations of cracks or other defects and the likely orientation of cracks or other defects within tested material 16 may be predicted based on the use for tested material 16. In some of these examples, electrical contacts 18 may then be attached to tested material 16 so that the electrical field and current flow within tested material 16 extends substantially normal to a predicted orientation of the crack or other defect.

In some examples, rather than predicting a location of the crack or other defect within tested material 16 and placing electrical contacts 18 based on the prediction, electrical contacts 18 may be attached to more than one surface of tested material 16. For example, if tested material 16 is in the shape of a cube, electrical contacts 18 may be attached to three orthogonal pairs of surfaces of the cube. By attaching a respective electrical contact of electrical contacts 18 to three orthogonal surfaces, the electrical field and current flow may be caused to extend in one of three orthogonal directions depending on the electrical contacts 18 through which the electrical signal is applied. This may increase a likelihood that induced the electrical field and current flow will extend within tested material 16 normal to the plane of any crack in tested material 16. Other examples are possible for other shapes. In some examples, electrical contacts 18 are distributed across a surface area of tested material 16, as shown in FIG. 1. In other examples, electrical contacts 18 are distributed around a perimeter of tested material 16. In some examples, plurality of electrical contacts 18 may be referred to as a set of N electrical contacts 18.

In some examples, system 10 may optionally include reference electrical contact 22, which may not be electrically coupled to tested material 16 and may be used for single-ended voltage measurements between one electrical contact of plurality of electrical contacts 18 and reference electrical contact 22. Reference electrical contact 22 may be at a selected voltage, such a ground or an offset voltage. In some examples, computing device 12 may use the single-ended voltages in the techniques described herein to determine whether tested material 16 includes a crack or other defect. In other examples, computing device 12 may determine differential voltages between two electrical contacts electrically coupled to tested material 16 comparing (e.g., subtracting) single ended voltages associated with the two electrical contacts, and computing device 12 may use these differential voltages in the techniques described herein to determine whether tested material 16 includes a crack or other defect. In still other examples, computing device 12 may determine a voltage between two of electrical contacts 18 directly, e.g., without first determining two single-ended voltages.

Computing device 12 is configured to control operation of system 10, including electrical signal source 14 and switch network 20. Computing device 12 may include any of a wide range of devices, including computer servers, desktop computers, notebook (i.e., laptop) computers, tablet computers, and the like. In some examples, computing device 12 may include a processor. The processor may include one or more microprocessors, digital signal processors (DSP), application specific integrated circuits (ASIC), field programmable gate arrays (FPGA), or other digital logic circuitry. In some examples, computing device 12 may include an analog-to-digital converter (ADC), or system 10 may include an ADC separate from computing device 12. In examples in which the ADC is separate from computing device 12, the ADC may be electrically coupled between a measurement electrical contact and computing device 12, such as between switch network 20 and computing device 12. The ADC may measure the voltage at a measurement electrical contact, e.g., under control of computing device 12.

In examples in which system 10 includes electrical signal source 14 and switch network 20, computing device 12 is communicatively coupled to electrical signal source 14 and electrically coupled to switch network 20, e.g., either directly or indirectly via an external device, such as an ADC. Computing device 12 may be configured to control electrical signal source 14 to output an electrical signal, and may be configured to control switch network 20 to connect at least one selected electrical contact from electrical contacts 18 to electrical signal source 14 to serve as a drive electrical contact, such that the electrical signal output by electrical signal source 14 is output to the drive electrical contact.

Computing device 12 is also configured to cause switch network 20 to connect a selected pair of electrical contacts 18 or one of electrical contacts 18 and reference electrical contact 22 to computing device 12 to serve as a pair of measurement electrical contacts. In this way, computing device 12 may determine a respective electrical parameter associated with each of a plurality of measurement electrical contacts in response to the electrical signal output by electrical signal source 14. The measured electrical parameters may include complex voltages, only real portions of voltages, only reactive portions of voltages, currents, impedances, or the like. The measured electrical parameters may form a measurement data set. For example, the measurement data set may include a plurality of electrical parameter values, and each respective electrical parameter value may be associated with a drive electrical contact and a measurement electrical contact with which the respective electrical parameter value was determined.

Computing device 12 also may determine a temperature of tested material 16 or a temperature of an environment in which tested material 16 is disposed during measurement of the measurement data set.

Computing device 12 is configured to determine whether tested material 16 includes a crack or other defect based on the one or more electrical parameters associated with tested material 16. For example, computing device 12 may determine a temperature-scaled control data set based on the measurement temperature associated with the measurement data set. Computing device then may generate comparisons of respective values of the measurement data set to corresponding respective values of the temperature-scaled control data set, and determine whether the tested material includes a crack or defect based on the comparisons.

Figure 3:
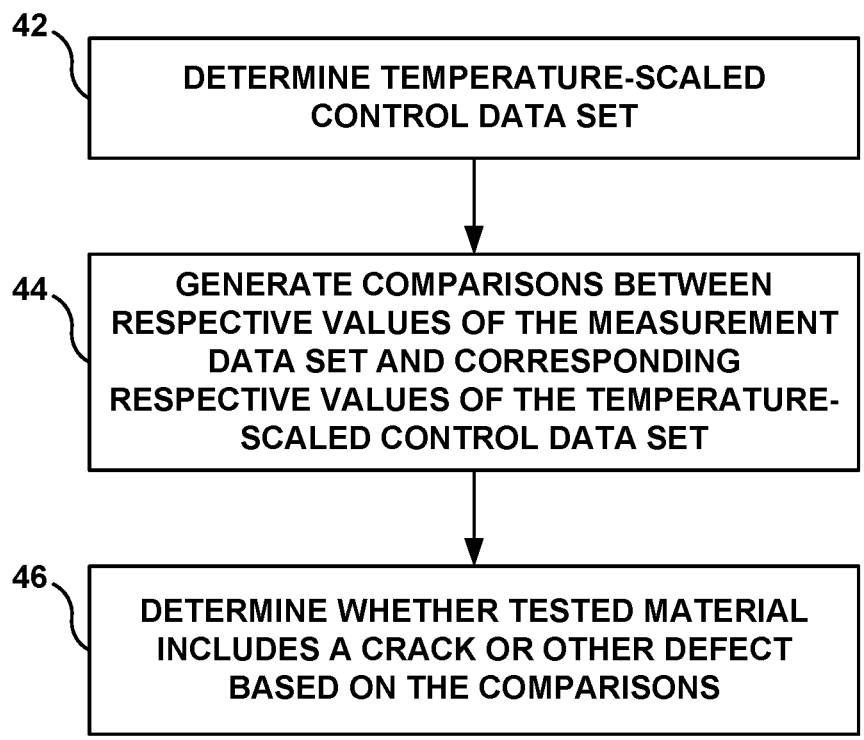
FIG. 3 is a flow diagram illustrating an example technique for determining whether a material includes a crack or other defect using a temperature-scaled control data set.

Further example operation of system 10 of FIG. 1 will be described with reference to the flow diagram shown in FIG. 3. FIG. 3 is a flow diagram illustrating an example technique for determining whether a tested material 16 includes a crack or other defect using a temperature-scaled control data set. The technique of FIG. 3 will be described with concurrent reference to system 10 of FIG. 1, but it will be understood that other systems that include more or fewer components than system 10 may perform the technique of FIG. 3 (e.g., a system that includes only computing device 12), and that system 10 may be used to perform other techniques (e.g., the techniques of FIGS. 4 and 6-8 among other techniques).

The technique of FIG. 3 may include determining, by computing device 12, a temperature-scaled control data set (42). Computing device 12 may determine the temperature-scaled control data set based at least on a measurement temperature associated with a measurement data set. For example, as described above with respect to FIG. 1, a measurement data set includes a plurality of electrical parameter values measured for tested material 16, e.g., using at least one drive electrical contact from electrical contacts 18 and at least one measurement electrical contact from electrical contacts 18 and 22. The measurement data set also may include or be associated with a measurement temperature, which corresponds to a temperature of tested material 16 or an environment in which tested material 16 is disposed a during measurement of the measurement data set.

In some examples, computing device 12 may determine the temperature-scaled control data set (42) based on the measurement temperature, a first control data set, a first control temperature associated with the first control data set, a second control data set, and a second control temperature associated with the second control data set. For example, computing device 12 may determine a weighted sum of the first control data set and the second control data set to determine the temperature-scaled control data set. The weighted sum may include a scaling factor (also referred to as a weighting factor) that is based on the measurement temperature, the first control temperature, and the second control temperature.

The scaling factor may be determined using a combination of the measurement temperature, the first control temperature, and the second control temperature, such as a linear combination, a polynomial combination, or the like. For example, assuming that the measurement temperature is $T_m$, the first control temperature is $T_{c1}$, and the second control temperature is $T_{c2}$, and $T_{c2}$ is greater than $T_{c1}$, a linear combination for determining the scaling factor, F, may be:

$$F = \frac{|T_m - T_{c1}|}{T_{c2} - T_{c1}} \quad (1)$$

Similarly, assuming that the measurement temperature is $T_m$, a polynomial combination for determining the scaling factor, F, may be:

$$F = A*T_m^2 + B*T_m + C \quad (2)$$

where A, B, and C are experimentally derived constants. A, B, and C may be determined by fitting a polynomial curve to experimental data of conductivity of tested material 16 versus temperature. Although equation (2) is a second-order polynomial, a polynomial of any order may be used, e.g., based on the best-fit curve to the experimental data.

Regardless of the combination used to determine the scaling factor, computing device 12 may utilize the scaling factor in a weighted sum to determine the temperature-scaled data set. For example, computing device 12 may utilize equation (3) to determine the temperature-scaled data set:

$$D_{ts} = F*D_{Tc1} + (1-F)*D_{Tc2} \quad (3)$$

Where $D_{ts}$ is the temperature-scaled control data set, $D_{Tc1}$ is the first control data set (associated with the first control temperature), and $D_{Tc2}$ is the second control data set (associated with the second control temperature). Similar to the measurement data set, each of the first control data set and the second control data set may include a plurality of control electrical parameter values, and each electrical parameter value may be associated with a combination of a drive electrical contact and a measurement electrical contact with which the respective control electrical parameter value was determined. Hence, determining the temperature-scaled control data set may include utilizing equation (3) for each respective control electrical parameter value of the first control data set and the corresponding respective control electrical parameter value of the second control data set.

Each of the control data sets may be based on tested material 16, a model, or an average of a plurality of materials that are similar to or substantially the same as tested material 16. For example, computing device 12 or another similar computing device may determine the control data sets at a time at which tested material 16 is manufactured, or a time at which an independent measurement (e.g., X-ray radiology or X-ray CT scan) may be used to verify that tested material 16 is intact, undamaged, or does not include a crack. Computing device 12 or the other similar computing device may determine the control data sets by causing electrical signal source 14 to output the electrical signal to at least one drive electrical contact from electrical contacts 18 and determining control electrical parameters associated with each of a plurality of measurement electrical contacts from electrical contacts 18. In some examples, the control electrical parameters may be determined using similar or substantially the same combinations of pairs of drive electrical contacts and measurement electrical contacts as are used to determine the measurement data set described above. The first control data set may be measured when tested material 16 is at a first temperature or is disposed in an environment that is a first temperature. The second control data set may be measured when tested material 16 is at a first temperature or is disposed in an environment that is a second temperature. In some examples, the first temperature may be lower than the second temperature. For example, the first temperature may be a temperature near to a lowest predicted use temperature for tested material 16 (e.g., −20° C.) and the second temperature may be a temperature near to a highest predicted use temperature for tested material 16 (e.g., 40° C.).

In other examples, the control data sets may be determined using a model of the tested material in an intact (undamaged) state. For example, computing device 12 may execute the model of tested material 16 and determine the control data sets based on the model. In some examples, the model may include a physics-based model of the electrical properties of tested material 16. In some other examples, the control data sets may be determined as an average (e.g., mean) of a plurality of similar materials (e.g., in geometry and composition) that are known to be intact (undamaged). The control data sets may be stored (e.g., in a memory device associated with computing device 12) for later use.

In other examples, rather than computing the temperature-scaled control data set, computing device 12 may determine the temperature-scaled control data set (42) by retrieving a selected temperature-scaled control data set of a plurality of temperature-scaled control data sets from a data structure, such as a look-up table stored in a memory device included in or associated with computing device 12. For example, the entries of the data structure may include respective control data sets, each respective control data set associated with a corresponding respective temperature value. Computing device 12 may select a respective control data set based on the measurement temperature associated with the measurement data set. Each temperature-scaled control data set in the data structure may have been determined experimentally or may have been determined using a weighted sum, as described above.

Once computing device 12 has determined a temperature-scaled control data set (42), computing device 12 may generate comparisons between respective electrical parameter values of the measurement data set and corresponding respective control electrical parameter values of the temperature-scaled control data set (44). For example, computing device 12 may generate a respective comparison between each electrical parameter value in the measurement data set and a corresponding respective control electrical parameter value of the temperature-scaled control data set. An electrical parameter value in the measurement data set may correspond to a respective control electrical parameter value when the electrical parameter value in the measurement data set is associated with the same combination of drive electrical contact and measurement electrical contact as the respective control electrical parameter value.

The comparison may be, for example, a difference, a ratio, or a more complex comparison based on a model of tested material 16. For example, computing device 12 may calculate an approximate impedance distribution within tested material 16 based on the measurement data set and the temperature-scaled control data set. In some examples, reconstruction of the impedance distribution may be achieved by minimizing difference between the output of a physics-based simulation tool with the respective control voltages, and the respective measurement voltages. For example, computing device 12 may be programmed with a finite element model (FEM) of tested material 16 which implements the physics-based simulation. The FEM of tested material 16 may include substantially accurate (e.g., accurate or approximately accurate) geometry of tested material 16 (e.g., the shape and volume of tested material 16), and also may include substantially accurate (e.g., accurate or approximately accurate) locations of electrical contacts 18 attached to tested material 16. In some examples, the FEM of tested material 16 may additionally include representative properties of tested material 16, including, for example, conductivity, resistivity, other related electrical properties, and the like. The FEM of tested material 16 may include representative properties of tested material 16 for each respective node representing tested material 16.

Calculating the approximate impedance distribution to determine whether tested material 16 includes a crack of other defect is an ill-posed inverse problem, in which the outputs (the respective measurement voltages) are known but the properties of tested material 16 that produce the outputs are unknown. Moreover, more than one set of properties of tested material 16 may produce the outputs. Hence, computing device 12 may utilize a regularization technique to constrain the solution to solutions more likely to represent the properties of tested material 32 that would produce the respective measurement voltages.

In particular, computing device 12 may generate an objective function which combines outputs of the physics-based model, respective control voltages, the respective measurement voltages, and the regularization term. For example:

$$\operatorname*{argmin}_{x}\left\{\mathcal{F}(x):=\frac{1}{2}\|f(x)-y\|_{\ell_2}^2+\lambda\frac{1}{2}\|Rx\|_{\ell_2}^2\right\}$$

where x is the approximate change in impedance distribution, f is an operator calculating the simulated difference in voltages based on input x utilizing the physics-based simulation, y is the measured difference in voltages, $l_2$ is a chosen norm, R is the regularization matrix, and $\lambda$ is the chosen weight of the regularization or regularization parameter. Computing device 12 may determine respective temperature-scaled model control voltages based on the physics-based model and inputs representative of the electrical signal(s) applied to the respective drive electrodes. The respective temperature-scaled model control voltages may be associated with respective combinations of measurement electrodes and drive electrodes used to collect the temperature-scaled control voltages from tested material 16. Computing device 12 then may determine, using the physics-based model and inputs representative of the electrical signal(s) applied to the respective drive electrodes, respective model measurement voltages. The respective model measurement voltages may be associated with respective measurement electrodes and drive electrodes used to collect the measurement voltages from tested material 16. For each respective model measurement voltage, computing device 12 may determine a respective difference between the respective model measurement voltage and the respective temperature-scaled model control voltage (f(x) in the equation above).

Computing device 12 also may determine a respective difference between the respective measurement voltage and the respective temperature-scaled control voltage for each respective measurement voltage measured using tested material 16 to generate a set of actual voltage differences (y in the equation above).

Computing device 12 then may minimize the objective function by updating one or more parameters of the physics-based model. Computing device 12 may continue to iterate the model until a stopping criterion is reached. Computing device 12 then may determine the approximate impedance distribution (or approximate change in impedance distribution) that is representative of the condition of tested material 16. When iteration completes the input to the model is the approximate impedance distribution.

Regardless of the manner in which computing device 12 generates the comparisons between respective electrical parameter values of the measurement data set and corresponding respective control electrical parameter values of the temperature-scaled control data set (44), computing device 12 then may determine whether tested material 16 includes a crack or other defect based on the comparisons (46). For example, in implementations in which computing device 12 utilizes a physics-based model and objective function, computing device 12 may then determine whether tested material 16 includes a crack or other defect based on the approximate change in impedance distribution. For example, computing device 12 may determine whether tested material 16 includes a crack or other defect based on the magnitude and location of the approximate impedance change within the material. In some examples, only the real portion of the impedance—the conductivity or resistivity—may be used by computing device 12 to determine whether tested material 16 includes a crack or other defect.

In some implementations in which computing device 12 determines ratios or differences between respective electrical parameters of the measurement data set and corresponding respective control electrical parameters, computing device 12 may compare each difference or ratio to a threshold voltage or threshold ratio. The threshold voltage value or ratio value may be selected so that a voltage difference or ratio above the threshold voltage value is meaningful (e.g., indicative of a crack or other defect) and a voltage difference below the threshold voltage value or ratio is not meaningful (e.g., is not indicative of a crack or other defect). In some examples, the threshold value may be selected to be a voltage or ratio value that is slightly greater than a noise floor of the measurement, such that any voltage difference or ratio that exceeds the noise floor is determined by computing device 12 to be indicative of a crack or other defect.

In some examples, after comparing each respective measurement voltage against a corresponding control voltage and comparing the difference or ratio to the threshold voltage value to determine if the respective measurement voltage is indicative of a crack or other defect, computing device 12 may determine whether a crack or other defect is present in tested material 16 based on the plurality of indications. For example, computing device 12 may determine a number of differences or ratios that are indicative of a crack and compare this number of differences to a threshold number of differences or ratios to determine if tested material 32 includes a crack or other defect.

As another example, computing device 12 may utilize pattern recognition. In some examples, for each measurement electrical contact, computing device 12 may sum all electrical parameter value differences or ratios associated with the respective measurement electrical contact. Computing device 12 may then determine whether any adjacent measurement electrical contacts are associated with sums that follow a predetermined pattern, such as a low-high-low pattern, a low-high-high-high-low pattern, or the like. The particular pattern that indicates that tested material 16 includes a crack or other defect may depend on positioning of electrical contacts 18, including spacing between adjacent electrical contacts of electrical contacts 18; crack location and orientation within tested material 16; and the like. In other examples, computing device 12 may use pattern recognition on each electrical parameter value difference or ratio associated with a respective drive electrical contact, and may compare the results of the various pattern recognitions to arrive at a final determination of whether tested material 16 includes a crack or other defect.

As an additional example, computing device 12 may determine whether tested material 16 includes a crack or other defect by determining whether any of the electrical parameter value differences or ratios, or the sum of electrical parameter value differences or ratios, associated with a single electrical contact, is an outlier compared to electrical parameter value differences or ratios, or sums of electrical parameter value differences or ratios, associated with other measurement electrical contacts. Cracks or other defects are expected to create regions of higher electrical resistance in tested material 16, which is expected to result in higher voltages being measured for electrical contact pairs in which current will flow across or through regions of higher electrical resistance. Hence, an outlier of electrical parameter value differences or ratios (or sums of electrical parameter value differences or ratios) indicates that tested material 16 includes a crack or other defect.

As a further example, computing device 12 may determine whether tested material 16 includes a crack or other defect by determining an overall score for material 16. For example, for each measurement electrical contact, computing device 12 may sum all electrical parameter values associated with a respective measurement electrical contact to generate a single value associated with the respective measurement electrical contact. Computing device 12 then may mathematically manipulate these values to arrive at a single score for tested material 16. For example, computing device 12 may sum the values, take each value to a predetermined power and sum the products, average the values, determine a weighted average of the values, or the like to determine a single score for tested material 16. Computing device 16 then may compare the single score to a threshold score value and determine that tested material 16 includes a crack or other defect if the single score is greater than the threshold score value.

Other examples of techniques that computing device 12 may implement to generate comparisons between respective electrical parameter values of the measurement data set and corresponding respective control electrical parameter values of the temperature-scaled control data set (44) and determine whether tested material 16 includes a crack or other defect (46) are also contemplated and will be described in further detail with respect to FIG. 7.

In this way, by utilizing a temperature-scaled control data set, computing device 12 may compensate for effects of temperature on the control data set and the measurement data set, e.g., due to changes of electrical conductivity as a function of temperature, and differences in temperature of tested material 16 between the measurement data set and the control data set. In some examples, as described above with reference to FIG. 2, tested material 16 may include multiple layers 34, each layer including a different material. The different materials may electrical conductivities that change differently as a function of temperature, which may lead to complex changes in conductivity of tested material 32 as a whole as a function of temperature. Utilizing a temperature-scaled control data set may compensate for this complex behavior.

Figure 4:
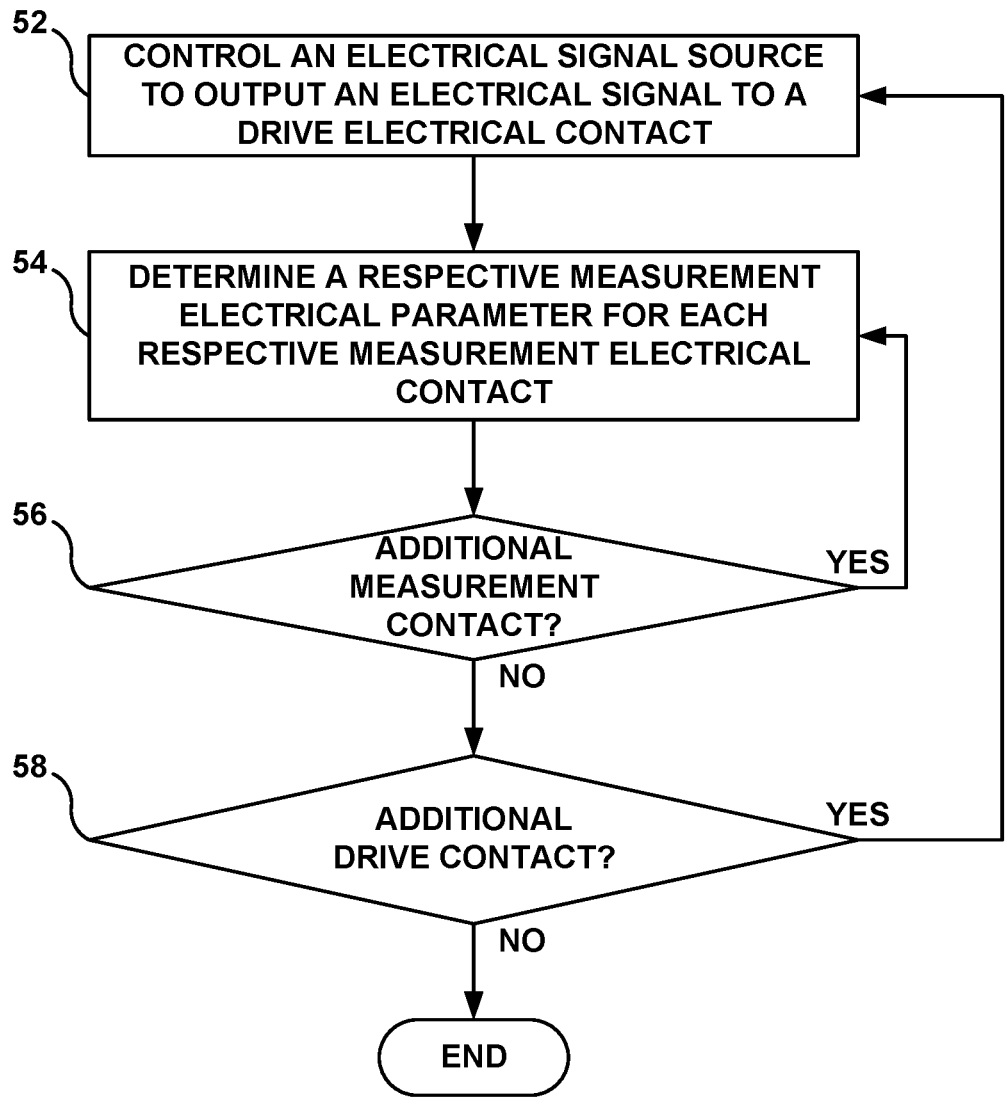
FIG. 4 is a flow diagram illustrating an example technique for determining values of electrical parameters associated with respective measurement electrical contacts for a measurement data set.

In some examples, as described above, computing device 12 may determine the measurement data set. FIG. 4 is a flow diagram illustrating an example technique for determining values of electrical parameters associated with respective measurement electrical contacts for a measurement data set. The technique of FIG. 4 will be described with concurrent reference to system 10 of FIG. 1, but it will be understood that other systems that include more or fewer components than system 10 may perform the technique of FIG. 4, and that system 10 may be used to perform other techniques (e.g., the techniques of FIGS. 3 and 6-8 among other techniques).

The technique of FIG. 4 includes applying an electrical signal to a first pair of drive electrical contacts electrically coupled to tested material 16 (52). For example, computing device 12 may cause switch network 20 to electrically couple electrical signal source 14 to a selected electrical contact from electrical contacts 18 or a selected pair of electrical contacts from electrical contacts 18, which serves as a drive electrical contact(s). The selected electrical contact or pair of electrical contacts 18 may include any electrical contact(s) of electrical contacts 18. In some examples, the electrical contacts in a selected pair of electrical contacts 18 may be adjacent to each other; in other examples, the electrical contacts in a selected pair of electrical contacts may be spaced apart. For example, in some instances, a selected pair of electrical contacts 18 may be substantially opposite each other in the array of electrical contacts, e.g., electrical contact 18A and electrical contact 18L or electrical contact 18F and electrical contact 18G, or may be separated by a predetermined number of electrical contacts 18, e.g., separated by two electrical contacts of electrical contacts 18.

Computing device 12 then may cause electrical signal source 14 to output the electrical signal to the drive electrical contact(s) (52), e.g., via switch network 20. The electrical signal may include an AC signal or a DC signal, and may include a current signal or a voltage signal. In some examples, the type of electrical signal may depend on the composition of tested material 16. For example, a DC signal may be used to measure a voltage of an electrically conductive or electrically semiconductive material, while an AC signal may be used to measure a voltage of an electrically conductive material, an electrically semiconductive material, or a dielectric material. Computing device 12 also may control electrical signal source 14 to generate the predetermined electrical signal with a selected amplitude, duration, frequency, and other signal characteristics.

The technique of FIG. 4 also includes, while applying the electrical signal to the first pair of drive electrical contacts, determining a respective measurement electrical parameter for each respective measurement electrical contact (54). For example, computing device 12 may cause switch network 20 to electrically couple computing device 12 to a selected pair of measurement electrical contacts. The selected pair of measurement electrical contacts may be any two electrical contacts from electrical contacts 18, neither of which is being used as a drive electrical contact, or may be reference electrical contact 22 and any one of electrical contacts 18 that is not being used as a drive electrical contact. In some examples, the two electrical contacts in the pair of measurement electrical contacts may be adjacent to each other, e.g., electrical contact 18B and electrical contact 18C, or electrical contact 18D and electrical contact 18J. In other example, the two electrical contacts in the pair of measurement electrical contacts may be spaced each other with one or more electrical contacts between, e.g., electrical contact 18B and electrical contact 18D, or electrical contact 18E and electrical contact 18H. Using adjacent electrical contacts as the pair of measurement electrical contacts may result in a higher signal-noise-ratio in the electrical parameter measurement, but may reduce an area of tested material 16 for which the electrical parameter is measured. Regardless of the particular electrical contacts coupled to computing device 12, computing device 12 may determine an electrical parameter between the pair of measurement electrical contacts (54) while electrical signal source 14 is outputting the electrical signal to the selected drive electrical contact(s) (52).

In some examples, computing device 12 may be configured to determine a respective measurement voltage for a plurality of measurement electrical contacts for each pair of drive electrical contacts. Hence, in some examples, the technique of FIG. 4 further includes determining whether there is an additional measurement electrical contact at which to determine a measurement electrical parameter (56) for the selected drive electrical contact(s).

In some examples in which pairs of electrical contacts 18 are used as measurement electrical contacts, each pair of measurement electrical contacts is a unique pair of electrical contacts (e.g., for the purposes of this the electrical contact pair 18A, 18B is the same as the electrical contact pair 18B, 18A). In some examples, no two pairs of measurement electrical contacts share a common electrical contact. For example, a third, different electrical contact pair (a second pair of measurement electrical contacts) may not share any electrical contacts with a second, different electrical contact pair (a first pair of measurement electrical contacts). In other examples, different pairs of measurement electrical contacts may include one common electrical contact. For example, a third, different electrical contact pair (a second pair of measurement electrical contacts) may share exactly one electrical contact with the second, different electrical contact pair (a first pair of measurement electrical contacts). In some examples, the common electrical contact is reference electrical contact 22.

In response to determining that there is an additional electrical contact to be used as a measurement electrical contact (the "YES" branch of decision block 56), computing device 12 may control switch network 20 to couple the selected additional electrical contact to computing device 12 as a measurement electrical contact. Computing device 12 then may determine a measurement electrical parameter associated with the selected additional electrical contact.

Computing device 12 may repeat this determination (56), coupling of selected measurement electrical contacts, and determination of a respective measurement electrical parameter (54) until computing device 12 determines there are no more additional electrical contacts 18 to be used as measurement electrical contacts for the selected drive electrical contact(s) (the "NO" branch of decision block 56). Computing device 12 then may determine whether there is an additional drive electrical contact(s) to output the electrical signal to (58). For example, computing device 12 may be configured to utilize each unique pair of electrical contacts or each unique pair of electrical contacts separated by a predetermined number of electrical contacts (e.g., two electrical contacts) as a pair of drive electrical contacts.

Upon selecting a new drive electrical contact(s) (the "YES" branch of decision block 58), computing device 12 may control switch network 20 to electrically couple the selected drive electrical contact(s) to electrical signal source 14. Computing device 12 then may cause electrical signal source 14 to output the electrical signal to the new selected drive electrical contact(s) (52). Computing device then may cause switch network 20 to electrically couple computing device 12 to a selected measurement electrical contact, and may determine a respective measurement electrical parameter associated with the selected measurement electrical contact (54). Again, computing device 12 may determine whether there is an additional measurement electrical contact at which to measure a measurement electrical parameter (56) for the selected drive electrical contact(s). In response to determining that there is an additional electrical contact to be used as a measurement electrical contact (the "YES" branch of decision block 56) for the selected drive electrical contact(s), computing device 12 may control switch network 20 to couple the selected additional electrical contact to computing device 12. Computing device 12 then may determine a measurement electrical parameter associated with the selected additional electrical contact. Computing device 12 may repeat this determination (56), coupling of selected measurement electrical contacts, and determination of a respective measurement electrical parameter (54) until computing device 12 determines there are no more additional pairs of electrical contacts 18 to be used as measurement electrical contacts for the selected drive electrical contact(s) (the "NO" branch of decision block 56).

Computing device 12 then may determine whether there is an additional electrical contact(s) of electrical contacts 18 to be used as a drive electrical contact(s) (58). Computing device 12 may repeat this algorithm until computing device 12 determines there are no more additional pairs of electrical contacts 18 to be used as a drive electrical contact(s) (the "NO" branch of decision block 58).

Once computing device 12 has determined that there are no more additional pairs of electrical contacts 18 to be used as a drive electrical contact(s) (the "NO" branch of decision block 58), the process of measuring or acquiring the electrical parameters may end. This general technique may be used by computing device 12 to acquire a control data set (e.g., a first control data set and/or a second control data set) at a time at which it is known that tested material 16 is intact, and may be used by computing device 12 to acquire a measurement data set at a time at which it is desired to determine whether tested material 16 includes a crack or other defect. In some examples, computing device may store the data set including the electrical parameters (e.g., a control data set) in a memory included in or associated with computing device 12.

Further, computing device 12 may utilize the electrical parameters (e.g., in a measurement data set or a control data set) to determine whether tested material 16 includes a crack or other defect based on a temperature-scaled control data set and a measurement data set (46) (FIG. 3).

Figure 5:
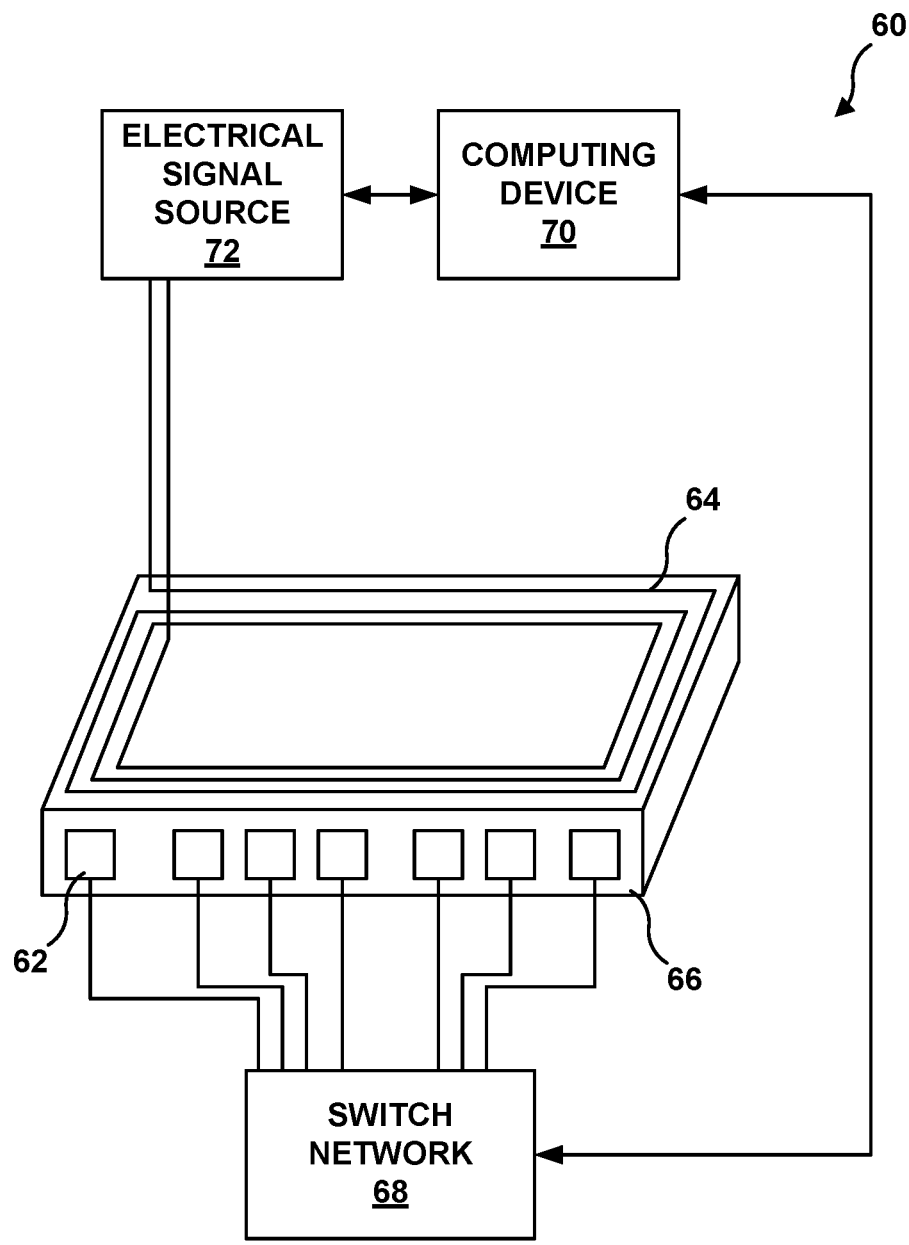
FIG. 5 is a conceptual and schematic block diagram illustrating an example system for determining values of electrical parameters associated with respective measurement electrical contacts for a measurement data set using an inductor to induce a voltage in a tested material.

In some examples, rather than utilizing drive electrical contact(s) to introduce an electrical signal to tested material 16, an inductor may be used to induce a voltage or current in tested material 16. For example, FIG. 5 is a conceptual and schematic block diagram illustrating an example system 60 for determining values of electrical parameters associated with respective measurement electrical contacts 62 for a measurement data set using an inductor 64 to induce a voltage in a tested material 66.

System 60 includes computing device 70, electrical signal source 72, switch network 68, and inductor 64. Electrical signal source 72 may be similar to or substantially the same as electrical signal source 14 of FIG. 1. Tested material 66 may be similar to or substantially the same as tested material 16 described with reference to FIG. 1. In the example of FIG. 5, plurality of electrical contacts 62 are attached to tested material 66, although plurality of electrical contacts 62 alternatively may be removably coupled to tested material 66.

In addition to the functionality described with reference to computing device 12 of FIGS. 1-4, computing device 70 in FIG. 5 may be configured to control switch network 68 to selectively couple a pair of electrical contacts from plurality of electrical contacts 62 to computing device 70 to allow computing device 70 to measure an electrical parameter associated with the pair of electrical contacts.

Plurality of electrical contacts 62 are electrically coupled to tested material 66, which is being tested using an inductor-related parameter measurement. Each electrical contact of plurality of electrical contacts 62 is electrically coupled to tested material 66 using any suitable type of electrical coupling, including, for example, an electrically conductive adhesive, an electrically conductive solder, embedding electrical contacts 62 in tested material 66, a dielectric adhesive and capacitive coupling, or the like. Each electrical contact of plurality of electrical contacts 62 is electrically coupled to switch network 68 using a respective electrically conductive lead. In some examples, the plurality of electrical contacts 62 are distributed across a surface of tested material 66, as shown in FIG. 5. In other examples, the plurality of electrical contacts 62 may be distributed around a perimeter of tested material 66 (e.g., on multiple sides of tested material 66). In some examples, plurality of electrical contacts 62 may be referred to as a set of N electrical contacts 62.

In some examples, system 50 may include one or more electrodes not electrically coupled to tested material 66, which may be used as a reference electrical contact for single-ended electrical parameter measurements between one electrical contact of plurality of electrical contacts 62 and the reference electrical contact. The reference electrical contact may be at a selected voltage, such a ground or an offset voltage. In some examples, the single-ended electrical parameters may be used in the techniques described herein to determine whether tested material 66 includes a crack or other defect. In other examples, computing device 70 may determine differential electrical parameters between two electrical contacts 62 electrically coupled to tested material 66 by comparing (e.g., subtracting) single ended electrical parameters associated with the two electrical contacts, and computing device 70 may utilize these differential electrical parameters in the techniques described herein to determine whether tested material 66 includes a crack or other defect.

Switch network 68 includes a plurality of inputs and a plurality of outputs, with respective inputs electrically coupled to each respective output by the network of switches. For example, switch network 68 may include an input electrically coupled to each respective electrical contact of electrical contacts 62, and at least a pair of inputs electrically coupled to computing device 70.

Computing device 70 is configured to control operation of system 60, including electrical signal source 72 and switch network 68. Computing device 70 may include any of a wide range of devices, including computer servers, desktop computers, notebook (i.e., laptop) computers, tablet computers, embedded computers, and the like. In some examples, computing device 70 may include a processor. The processor may include one or more microprocessors, digital signal processors (DSP), application specific integrated circuits (ASIC), field programmable gate arrays (FPGA), or other digital logic circuitry.

Computing device 70 is communicatively coupled to electrical signal source 72 and electrically coupled to switch network 68. Computing device 70 may be configured to control electrical signal source 72 to output an electrical signal, and may be configured to control switch network 68 to couple a selected electrical contact from plurality of electrical contacts 62 to computing device 70 to serve as a measurement electrical contact. In this way, computing device 70 may measure an electrical parameter (e.g., induced voltage or current) across tested material 66 in response to the electrical signal output by electrical signal source 72.

Electrical signal source 72 is electrically coupled to inductor 64, which may be attached to tested material 66 or separate from and adjacent to tested material 66. Inductor 64 may include an electrical conductor arranged in any geometry suitable for an inductor. In some examples, inductor 64 may include a substantially planar coil, as shown in FIG. 5. In examples in which inductor 64 includes a coil, inductor 64 may include any number of windings. Inductor 64 may include any suitable electrically conductive material, including, for example, copper, aluminum, silver, gold, or the like. Inductor 64 may be any size, and in some examples, may be sized and shaped so that a perimeter of inductor 64 is approximately the same size as a perimeter of the surface of tested material 66 near which inductor 64 will be positioned. This may allow relatively complete coverage of tested material 66 when testing for a crack or other defect. In other examples, inductor 64 may include another shape or size, such as a solenoid sized so that tested material 66 may be placed in the bore of the solenoid. The solenoid may have any shape, such as rectangular prism, cylindrical, elliptical cylinder, or the like.

Figure 6:
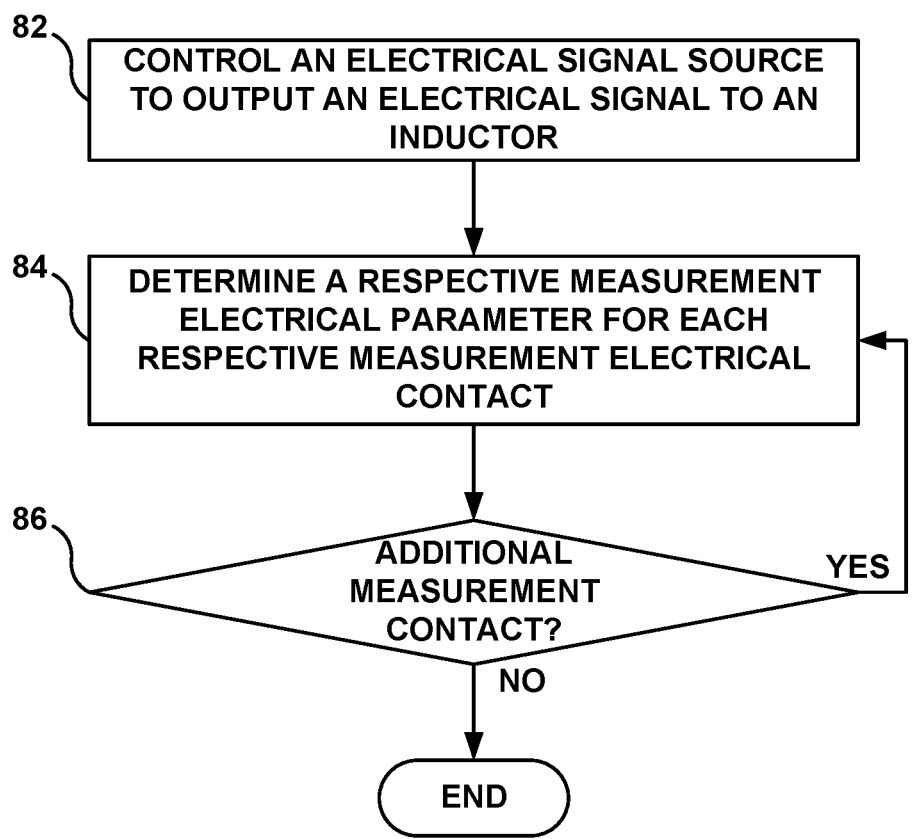
FIG. 6 is a flow diagram illustrating an example technique for determining values of electrical parameters associated with respective measurement electrical contacts for a measurement data set.

FIG. 6 is a flow diagram illustrating an example technique for determining values of electrical parameters associated with respective measurement electrical contacts for a measurement data set. The technique of FIG. 6 will be described with reference to system 60 of FIG. 5 for clarity. However, it will be appreciated that the technique of FIG. 6 may be performed by other systems and computing devices, and that system 60 may be used to perform other techniques.

The technique of FIG. 6 includes controlling electrical signal source 72 to output an electrical signal to inductor 64 (82). For example, computing device 70 may control electrical signal source 72 to output the electrical signal to inductor 64 (82). The electrical signal may include an AC voltage or current. Computing device 70 also may control electrical signal source 72 to generate the AC voltage or current with a selected amplitude, duration, frequency, phase, and other signal characteristics.

The technique of FIG. 6 also includes, while applying the electrical signal to inductor 64, determining a respective electrical parameter (e.g., induced voltage or current) associated with a respective measurement electrical contact of electrical contacts 62 (84). For example, computing device 70 may cause switch network 68 to electrically couple computing device 70 to a selected pair of electrical contacts from plurality of electrical contacts 62. The selected pair of electrical contacts may be any two electrical contacts from plurality of electrical contacts 62. In some examples, the two electrical contacts in the selected pair of electrodes may be directly adjacent to each other with no other electrical contacts in between. In other examples, the two electrical contacts in the selected pair of electrical contacts may be spaced apart from each other with one or more electrical contacts in between. Using adjacent electrical contacts as the pair of electrical contacts may result in a higher signal-noise-ratio in the measurement of the electrical parameter, but may reduce an area of tested material 66 for which the electrical parameter is measured. Regardless of the particular electrodes coupled to computing device 70, computing device 70 may measure a respective electrical parameter associated with the selected pair of electrical contacts (84) while electrical signal source 72 is outputting the electrical signal to inductor 64 (82).

In some examples, computing device 70 may be configured to measure a respective electrical parameter for a plurality of electrical contacts from electrical contacts 62. Hence, in some examples, the technique of FIG. 6 further includes determining whether there is an additional electrical contact(s) at which to measure a respective electrical parameter (86). In some examples in which measurement electrical contacts are pairs of electrical contacts, each pair of measurement electrical contacts is a unique pair of electrical contacts. In some examples, no two pairs of measurement electrical contacts share a common electrical contact. For example, a first pair of electrical contacts may not share any electrodes with a second, different pair of electrical contacts. In other examples, different pairs of electrical contacts may include one common electrical contact. For example, a first pair of electrical contacts may share exactly one electrical contact with a second, different pair of electrical contacts.

In response to determining that there is an additional electrical contact(s) to be used as a measurement electrical contact(s) (the "YES" branch of decision block 86), computing device 70 may control switch network 68 to couple the selected additional electrical contact(s) to computing device 70. Computing device 70 then may determine the electrical parameter associated with the selected additional electrical contact(s) (84).

Computing device 70 may repeat this determination (86), coupling of a selected electrical contact(s), and measurement of a respective electrical parameter associated with the selected electrical contact(s) (84) until computing device 70 determines there are no more additional electrical contact(s) from plurality of electrical contacts 62 to be used as measurement electrodes (the "NO" branch of decision block 86).

Once computing device 70 has determined that there are no more additional electrical contact(s) from plurality of electrical contacts 62 to be used as measurement electrical contacts (the "NO" branch of decision block 86), the technique may end. This general technique may be used by computing device 70 to acquire a control data set (e.g., a first control data set and/or a second control data set) at a time at which it is known that tested material 66 is intact, and may be used by computing device 70 to acquire a measurement data set at a time at which it is desired to determine whether tested material 66 includes a crack or other defect. In some examples, computing device 70 may store the data set including the electrical parameters (e.g., a control data set) in a memory included in or associated with computing device 70.

Further, computing device 70 may utilize the electrical parameters (e.g., in a measurement data set or a control data set) to determine whether tested material 66 includes a crack or other defect based on a temperature-scaled control data set and a measurement data set (46) (FIG. 3).

Some example technique for determining whether a tested material includes a crack or other defect based on a temperature-scaled control data set and a measurement data set were described above with reference to FIG. 3. FIG. 7 is a flow diagram illustrating other techniques generating comparisons between respective values of the measurement data set and corresponding respective values of the temperature-scaled control data set (44) and determining whether material 16 includes a crack or other defect based on the comparisons (46). The technique of FIG. 7 will be described with reference to system 10 of FIG. 1 for clarity. However, it will be appreciated that the technique of FIG. 7 may be performed by other systems and computing devices (e.g., system 60 and computing device 70 of FIG. 5), and that system 10 may be used to perform other techniques.

Figure 7:
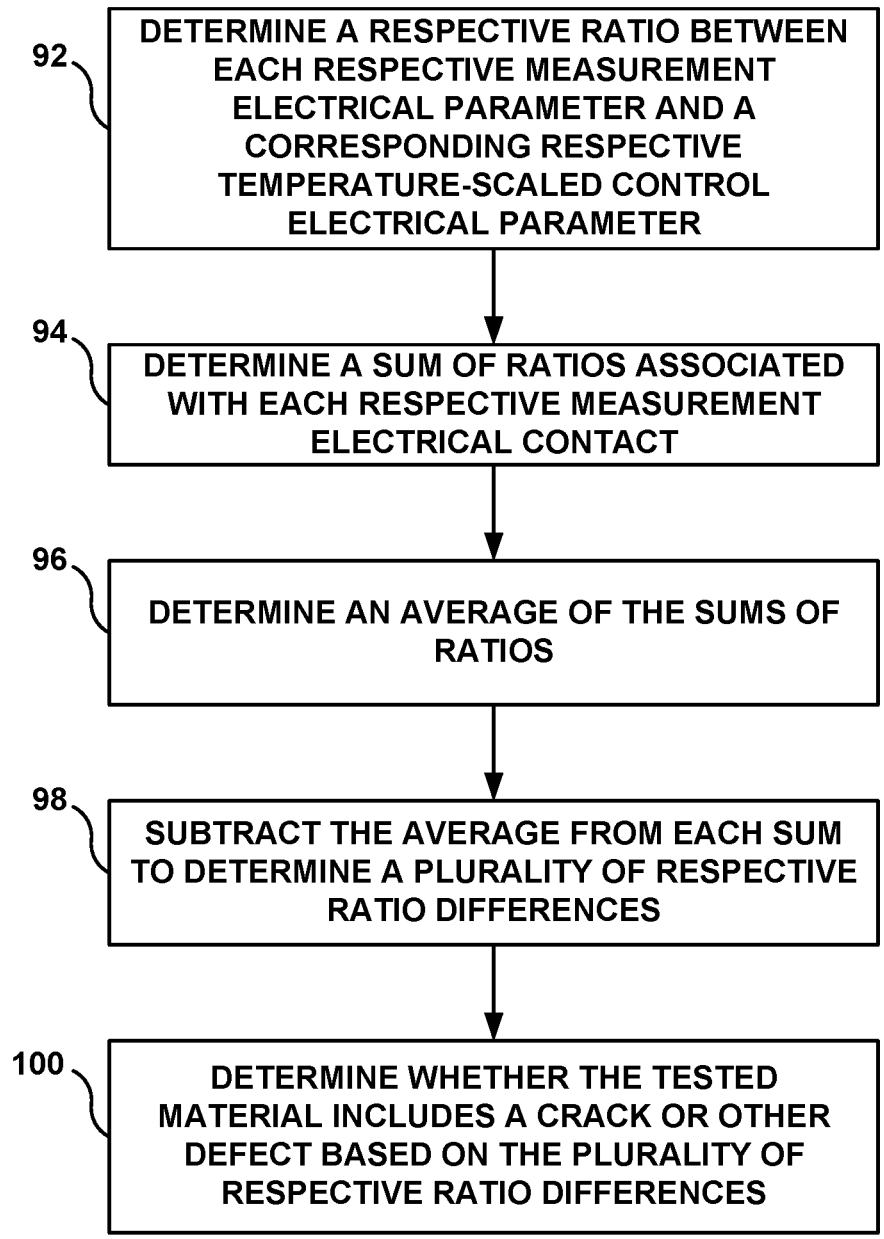
FIG. 7 is a flow diagram illustrating an example technique for determining whether a material includes a crack or other defect using a temperature-scaled control data set.

The technique of FIG. 7 includes determining, by computing device 12, a ratio between each respective measurement electrical parameter and a corresponding respective temperature-scaled control electrical parameter (92). The respective measurement electrical parameter and the respective temperature-scaled control electrical parameter are associated with the same combination of drive electrical contact(s) and measurement electrical contact(s). Each of the respective measurement electrical parameter and the corresponding respective temperature-scaled control electrical parameter may have been previously determined as described above with reference to FIGS. 1-6. The result of this step may include a plurality of ratios, each ratio associated with a combination of drive electrical contact(s) and measurement electrical contact(s)

The technique of FIG. 7 also includes determining, by computing device 12, a respective sum of the respective ratios associated with each respective measurement electrical contact (94). For example, as described above, each respective measurement electrical contact may have a plurality of associated electrical parameter values, as computing device 12 may have determined electrical parameter values for the respective measurement electrical contact for each of a plurality of drive electrical contacts. Hence, in examples in which each respective measurement electrical contact is associated with a respective plurality of electrical parameter values, each respective measurement electrical contact is then associated with a respective plurality of ratios. To determine a single value for each respective measurement electrical contact, computing device 12 may sum the respective plurality of ratios associated with the respective measurement electrical contact.

Computing device 12 then may determine an average of the sums of the ratios (96), e.g., by summing the respective sums of the ratios, then dividing the sum of the sums by the number of measurement electrical contacts. Computing device 12 may subtract the average of the sums of the ratios from the respective sums of the ratios to determine a plurality of respective ratio differences (98). The ratio differences may also be referred to residual ratios. A respective ratio difference is associated with each measurement electrical contact. The process of determining the average of the sums of the ratios (96) and subtracting the average of the sums of the ratios from the respective sums of the ratios (98) may be referred to as de-trending or de-averaging.

In some examples, rather than de-averaging, computing device 12 may subject the sums of the ratios to a linear de-trending. In a linear de-trending, computing device 12 may fit a linear curve (e.g., a line of y=mx+b) to the set of sums of the ratios as a function of position or pair of adjacent electrical contacts.

Regardless of the technique used to de-trend the sums of the ratios, computing device 12 may utilize the de-trended sums of the ratios (e.g., the plurality of respective residual ratios or the plurality of respective ratio differences) to determine whether material 16 includes a crack or other defect (100). For example, computing device 12 may utilize pattern recognition, identify at least one outlier, or mathematically manipulate the plurality of respective ratio differences as described above in FIG. 3 to determine whether material 16 includes a crack or other defect (100).

In any of the techniques described herein, computing device 12 may output a representation of the determination of whether material 16 includes a crack or other defect. In some examples, the representation may include a simplified output, such as an indication of "Yes" or "No," "Crack" or "No Crack," "Damaged" or "Intact," or the like. The representation may be textual, icon-based, color-based, or the like. For example, the representation may include a green light to represent that material 16 is still intact or a red light to represent that material 16 is damages or includes a crack or other defect.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

EXAMPLES

Comparative Example

Figure 8:
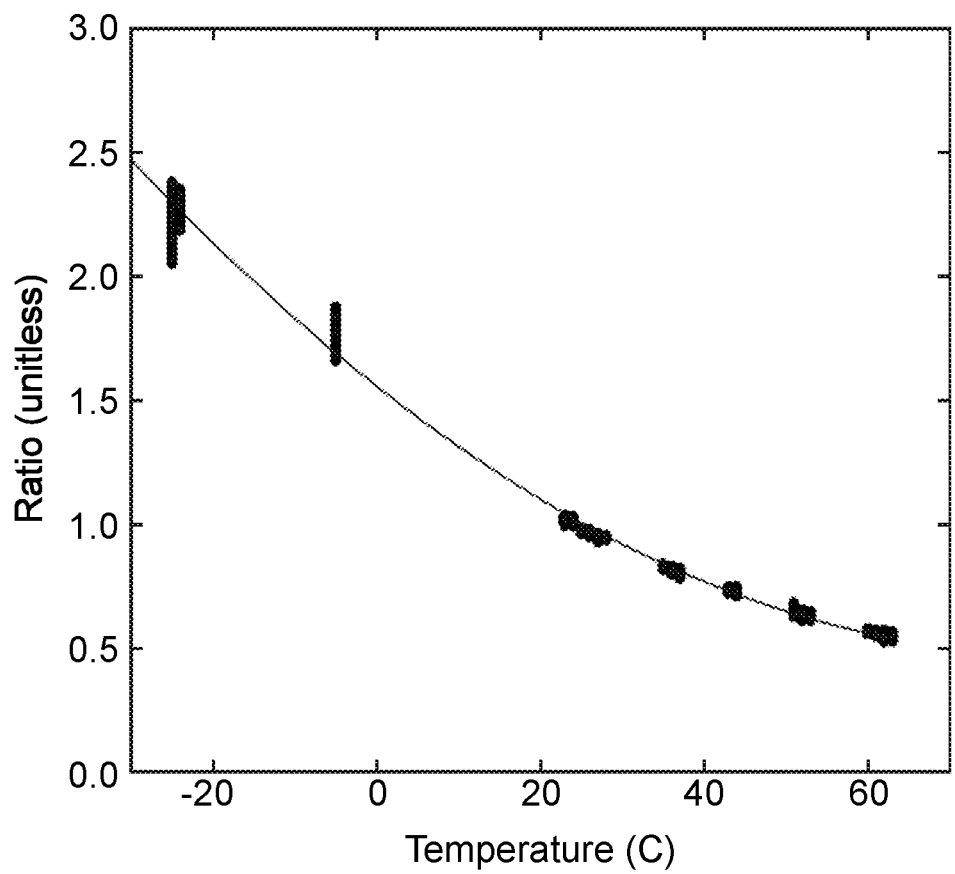
FIG. 8 is a plot of ratio of measurement electrical parameter value to control electrical parameter value versus temperature for an example tested material.

FIG. 8 is a plot of ratio of measurement electrical parameter value to control electrical parameter value versus temperature for an example tested material. FIG. 8 below shows the results of this ratio as a scatter plot for 10 tested materials, all known to be undamaged, each with 336 measurements. As such, FIG. 8 includes over 3000 data points. At room temperature and above, the data is tightly grouped, as expected. However, when the tested materials are cold the ceramic is more resistive, and more current may flow through the leakage paths (e.g., layers of the tested material other than which are being interrogated). The nonuniformity may also be due to a nonuniformity in material composition. This leads to the ratio of measurements being nonuniform across an individual tested material. This nonuniformity is apparent as a less tightly grouped set of ratios in FIG. 8.

Table 1 shows the range of scores (minimum and maximum) for broken and unbroken tested materials when using a single control data set. A large separation is desired between the group of broken tested materials and the group of unbroken materials. The ratio of the minimum broken score to maximum unbroken score demonstrates the degree of separation between the two groups. Maximizing this ratio improves the true positive and false positive statistics.

TABLE 1

|  | Broken Max | Broken Min | Unbroken Max | Unbroken Min | Broken Min/ Unbroken Max |
|---|---|---|---|---|---|
| Very Cold (−24° C. or −25° C.) | 1.50E+07 | 25.88 | 11.01 | 5.75E−03 | 2.35 |
| Cold (−5° C.) | 4.22E+06 | 1.187 | 1.607 | 8.18E−03 | 0.738 |
| Room Temp | 3.66E+05 | 0.349 | 2.22E−05 | 1.18E−09 | 1.57E+04 |

Example 1

Table 2 shows score versus temperature for a plurality of tested materials when using temperature-scaled control data sets determined using linear data scaling. For each measurement temperature, a temperature-scaled data set was determined using a weighted sum of two control data sets, wherein the weighting factor was determined using a linear combination based on the measurement temperature, the first control temperature associated with the first control data set, and the second control temperature associated with the second control data set (e.g., as shown in equations (1) and (3)). The first control temperature associated with the first control data set was 25° C. and the second control temperature associated with the second control data set was −24° C. or −25° C. (each tested material was measured individually). As shown in Table 2, the separation between unbroken tested materials and broken tested materials is larger than in Table 1, particularly at lower temperatures.

TABLE 2

| Temperature | Broken Max | Broken Min | Unbroken Max | Unbroken Min | Broken Min/ Unbroken Max |
|---|---|---|---|---|---|
| Very Cold (−24° C. or −25° C.) | 1.17E+05 | 0.3978 | 3.54E−05 | 1.34E−07 | 1.12E+04 |
| Cold (−5° C.) | 1.41E+05 | 0.143 | 1.71E−03 | 2.04E−07 | 8.36E+01 |
| Room Temp | 2.72E+05 | 0.2952 | 1.48E−05 | 1.63E−09 | 1.99E+04 |

Example 2

Table 3 shows score versus temperature for a plurality of tested materials when using temperature-scaled control data sets determined using polynomial data scaling. For each measurement temperature, a temperature-scaled data set was determined using a weighted sum of two control data sets, wherein the weighting factor was determined using a polynomial combination based on the measurement temperature, the first control temperature associated with the first control data set, and the second control temperature associated with the second control data set (e.g., as shown in equations (2) and (3)). The polynomial constant A was 1.54E−04, B was 2.59E−02, and C was 1.55. The first control temperature associated with the first control data set was 25° C. and the second control temperature associated with the second control data set was −24° C. or −25° C. (each tested material was measured individually). As shown in Table 3, the separation between unbroken tested materials and broken tested materials is larger than in Table 1, particularly at lower temperatures.

TABLE 3

| Temperature | Broken Max | Broken Min | Unbroken Max | Unbroken Min | Broken Min/ Unbroken Max |
|---|---|---|---|---|---|
| Very Cold (−24° C. or −25° C.) | 1.19E+05 | 0.404 | 3.54E−05 | 1.34E−07 | 1.14E+04 |
| Cold (−5° C.) | 1.94E+05 | 0.179 | 1.52E−03 | 9.50E−07 | 1.17E+02 |
| Room Temp | 2.96E+05 | 0.3096 | 1.60E−05 | 1.90E−09 | 1.94E+04 |

Clause 1: A method comprising: determining, by a computing device, a temperature-scaled control data set based on a measurement temperature associated with a measurement data set, wherein the measurement data set is associated with a tested material and comprises a plurality of values representative of electrical parameters of the tested material; generating, by the computing device, comparisons of respective values of the measurement data set to corresponding respective values of the temperature-scaled control data set; and determining, by the computing device, whether the tested material includes a crack or defect based on the comparisons.

Clause 2: The method of clause 1, wherein determining the temperature-scaled control data set comprises: determining, by the computing device, the temperature-scaled control data set based on the measurement temperature, a first control data set associated with a first control temperature, a second control data set associated with a second control temperature, the first control temperature, and the second control temperature.

Clause 3: The method of clause 2, wherein determining the temperature-scaled control data set comprises: determining, by the computing device, a weighted sum of the first control data set and the second control data set based on a scaling factor, the first control data set, and the second control data set.

Clause 4: The method of clause 3, further comprising: determining, by the computing device, the scaling factor using a linear combination based on the measurement temperature, the first control temperature, and the second control temperature.

Clause 5: The method of clause 3, further comprising: determining, by the computing device, the scaling factor using a polynomial combination based on the measurement temperature, the first control temperature, and the second control temperature.

Clause 6: The method of any one of clauses 2 to 5, further comprising: determining, by the computing device, for each respective electrical contact of a plurality of electrical contacts electrically coupled to the tested material, a respective measurement electrical parameter associated with the measurement temperature, wherein the measurement data set comprises the respective measurement electrical parameters, and wherein the first control data set comprises corresponding respective first control electrical parameters associated with the first control temperature and the second control data set comprises corresponding respective second control electrical parameters associated with the second control temperature.

Clause 7: The method of clause 6, wherein the respective measurement electrical parameters, the corresponding respective first control electrical parameters, and the corresponding respective second control electrical parameters comprise at least one of respective voltage values or respective electrical impedance values.

Clause 8: The method of clause 6 or 7, wherein determining, for each respective measurement electrical contact electrically coupled to the tested material, the respective measurement electrical parameter comprises: controlling, by the computing device, an electrical signal source to output an electrical signal to at least one drive electrical contact, wherein the at least one drive electrical contact is selected from the plurality of electrical contacts electrically coupled to the tested material; and determining, by the computing device, for each respective measurement electrical contact, a respective measurement electrical parameter in response to the electrical signal.

Clause 9: The method of clause 8, wherein the electrical signal comprises a voltage signal or a current signal.

Clause 10: The method of clause 6 or 7, wherein determining, for each respective measurement electrical contact electrically coupled to the tested material, the respective measurement electrical parameter comprises: controlling, by the computing device, an electrical signal source to output an electrical signal to at least one inductor adjacent to the tested material; and determining, by the computing device, for each respective measurement electrical contact, a respective measurement electrical parameter in response to the electrical signal.

Clause 11: The method of clause 1, wherein determining the temperature-scaled control data set based on the measurement temperature comprises: retrieving, by the computing device, the temperature-scaled control data set from a look-up table based on the measurement temperature.

Clause 12: The method of any one of clauses 1 to 11, wherein determining whether the tested material includes the crack or defect based on the comparisons comprises: determining a respective ratio between each respective measurement electrical parameter and a corresponding respective control electrical parameter from the temperature-scaled control data set; and determining whether the tested material includes the crack or defect based on the respective ratios.

Clause 13: The method of clause 12, wherein determining whether the tested material includes the crack or defect based on the respective ratios comprises taking each respective ratio to a predetermined power to determine a plurality of respective products, summing the plurality of respective products, and comparing the sum of the plurality of respective products to a threshold value.

Clause 14: The method of clause 12, wherein determining whether the tested material includes the crack or defect based on the respective ratios comprises identifying at least one predetermined pattern in a set of respective ratios associated with adjacent electrical contacts coupled to the tested material and associated with respective measurement electrical parameters.

Clause 15: The method of clause 12, wherein determining whether the tested material includes the crack or defect based on the respective ratios comprises identifying at least one outlier ratio from the respective ratios.

Clause 16: The method of any one of clauses 1 to 15, wherein the tested material comprises an electrically conductive or electrically semiconductive material.

Clause 17: The method of any one of clauses 1 to 16, wherein the tested material comprises a ceramic.

Clause 18: The method of any one of clauses 1 to 17, wherein the tested material comprises a multilayer material comprising at least one layer comprising a ceramic.

Clause 19: A system comprising: a computing device configured to: determine a temperature-scaled control data set based on a measurement temperature associated with a measurement data set, wherein the measurement data set is associated with a tested material and comprises a plurality of values representative of electrical parameters of the tested material; generate comparisons of respective values of the measurement data set to corresponding respective values of the temperature-scaled control data set; and determine whether the tested material includes a crack or defect based on the comparisons.

Clause 20: The system of clause 19, wherein the computing device is configured to determine the temperature-scaled control data set by at least: determining the temperature-scaled control data set based on the measurement temperature, a first control data set associated with a first control temperature, a second control data set associated with a second control temperature, the first control temperature, and the second control temperature.

Clause 21: The system of clause 20, wherein the computing device is configured to determine the temperature-scaled control data set by at least: determining, by the computing device, a weighted sum of the first control data set and the second control data set based on a scaling factor, the first control data set, and the second control data set.

Clause 22: The system of clause 21, wherein the computing device is further configured to: determine the scaling factor using a linear combination based on the measurement temperature, the first control temperature, and the second control temperature.

Clause 23: The system of clause 21, wherein the computing device is further configured to: determine the scaling factor using a polynomial combination based on the measurement temperature, the first control temperature, and the second control temperature.

Clause 24: The system of any one of clauses 20 to 23, further comprising: the tested material; a plurality of electrical contacts electrically coupled to the tested material; and an electrical signal source; wherein the computing device is further configured to: determine for each respective electrical contact of the plurality of electrical contacts, a respective measurement electrical parameter, wherein the measurement data set comprises the respective measurement electrical parameters, and wherein the first control data set comprises corresponding respective first control electrical parameters associated with the first control temperature and the second control data set comprises corresponding respective second control electrical parameters associated with the second control temperature.

Clause 25: The system of clause 24, wherein the respective measurement electrical parameters, the corresponding respective first control electrical parameters, and the corresponding respective second control electrical parameters comprise at least one of respective voltage values or respective electrical impedance values.

Clause 26: The system of clause 24 or 25, wherein the computing device is configured to determine, for each respective measurement electrical contact electrically coupled to the tested material, the respective measurement electrical parameter by at least: controlling, by the computing device, the electrical signal source to output an electrical signal to at least one drive electrical contact, wherein the at least one drive electrical contact is selected from the plurality of electrical contacts electrically coupled to the tested material; and determining, for each respective measurement electrical contact, a respective measurement electrical parameter in response to the electrical signal.

Clause 27: The system of clause 26, wherein the electrical signal comprises a voltage signal or a current signal.

Clause 28: The system of clause 24 or 25, wherein the computing device is configured to determine, for each respective measurement electrical contact electrically coupled to the tested material, the respective measurement electrical parameter by at least: controlling an electrical signal source to output an electrical signal to at least one inductor adjacent to the tested material; and determining, for each respective measurement electrical contact, a respective measurement electrical parameter in response to the electrical signal.

Clause 29: The system of clause 19, wherein the computing device is configured to determine the temperature-scaled control data set based on the measurement temperature by at least: retrieving the temperature-scaled control data set from a look-up table based on the measurement temperature.

Clause 30: The system of any one of clauses 19 to 29, wherein the computing device is configured to determine whether the tested material includes the crack or defect based on the comparisons by at least: determining a respective ratio between each respective measurement electrical parameter and a corresponding respective control electrical parameter from the temperature-scaled control data set; and determining whether the tested material includes the crack or defect based on the respective ratios.

Clause 31: The system of clause 30, wherein the computing device is configured to determine whether the tested material includes the crack or defect based on the respective ratios by at least taking each respective ratio to a predetermined power to determine a plurality of respective products, summing the plurality of respective products, and comparing the sum of the plurality of respective products to a threshold value.

Clause 32: The system of clause 30, wherein the computing device is configured to determine whether the tested material includes the crack or defect based on the respective ratios by at least identifying at least one predetermined pattern in a set of respective ratios associated with adjacent electrical contacts coupled to the tested material and associated with respective measurement electrical parameters.

Clause 33: The system of clause 30, wherein the computing device is configured to determine whether the tested material includes the crack or defect based on the respective ratios by at least identifying at least one outlier ratio from the respective ratios.

Clause 34: The system of any one of clauses 19 to 33, wherein the tested material comprises an electrically conductive or electrically semiconductive material.

Clause 35: The system of any one of clauses 19 to 34, wherein the tested material comprises a ceramic.

Clause 36: The system of any one of clauses 19 to 35, wherein the tested material comprises a multilayer material comprising at least one layer comprising a ceramic.

Clause 37: A computer readable storage medium comprising instructions that, when executed, cause a computing device to: determine a temperature-scaled control data set based on a measurement temperature associated with a measurement data set, wherein the measurement data set is associated with a tested material and comprises a plurality of values representative of electrical parameters of the tested material; generate comparisons of respective values of the measurement data set to corresponding respective values of the temperature-scaled control data set; and determine whether the tested material includes a crack or defect based on the comparisons.

Clause 38: The computer readable storage medium of clause 37, wherein the instructions cause the computing device to determine the temperature-scaled control data set by at least: determining the temperature-scaled control data set based on the measurement temperature, a first control data set associated with a first control temperature, a second control data set associated with a second control temperature, the first control temperature, and the second control temperature.

Clause 39: The computer readable storage medium of clause 38, wherein the instructions cause the computing device to determine the temperature-scaled control data set by at least: determining, by the computing device, a weighted sum of the first control data set and the second control data set based on a scaling factor, the first control data set, and the second control data set.

Clause 40: The computer readable storage medium of clause 39, wherein the instructions further cause the computing device to: determine the scaling factor using a linear combination based on the measurement temperature, the first control temperature, and the second control temperature.

Clause 41: The computer readable storage medium of clause 39, wherein the instructions further cause the computing device to: determine the scaling factor using a polynomial combination based on the measurement temperature, the first control temperature, and the second control temperature.

Clause 42: The computer readable storage medium of clause 37, wherein the instructions cause the computing device to determine the temperature-scaled control data set based on the temperature associated with a measurement data set by at least: retrieving the temperature-scaled control data set from a look-up table based on the measurement temperature.

Various examples have been described. These and other examples are within the scope of the following claims.

What is claimed is:

1. A system for verifying structural integrity of a tested material that comprises at least one of an electrically conductive material or an electrically semiconductive material, the system comprising:
  interface hardware; and
  processing circuitry communicatively coupled to the interface hardware, the processing circuitry being configured to:
    control, via the interface hardware, a switch network to designate one or more measurement electrical contacts from a plurality of electrical contacts, each of the one or more measurement electrical contacts being electrically coupled to the tested material and communicatively coupled to the computing device;
    control, via the interface hardware, an electrical signal source to output an electrical signal through an inductor to the tested material, wherein the inductor is electrically coupled to the tested material;
    receive, via the interface hardware and from the one or more measurement electrical contacts that are electrically coupled to the tested material, one or more electrical parameters of the tested material while the electrical signal output by the electrical signal source is conducted through the tested material;
    determine a temperature-scaled control data set (Dts) based on a measurement temperature (Tm) associated with a measurement data set (Dm) that comprises a plurality of values representative of the one or more electrical parameters of the tested material at the measurement temperature (Tm) at least in part by:
      determining the measurement temperature (Tm), a first control data set (Dc1) associated with a first control temperature, a second control data set (Dc2) associated with a second control temperature, the first control temperature (Tc1), and the second control temperature (Tc2); and
      determining a weighted sum of the first control data set and the second control data set based on a scaling factor (F), the first control data set, and the second control data set; and wherein the scaling factor (F) is
        (i) a linear combination based on the measurement temperature, the first control temperature, and the second control temperature according to $$F = \frac{|T_m - T_{c1}|}{T_{c2} - T_{c1}} \text{ or}$$

(ii) a polynomial combination based on the measurement temperature according to $$F = A*T_m^2 + B*T_m + C,$$

where each of A, B, and C represents a respective experimentally derived constant determined by fitting a polynomial curve to experimental data of conductivity of the tested material versus temperature;

generate comparisons of respective values of the measurement data set to corresponding respective values of the temperature-scaled control data set (Dts);

determine whether the tested material includes a defect based on the comparisons; and output, via the interface hardware, an indication of the determination of whether the tested material includes the defect.

2. The system of claim 1, further comprising:
the tested material;
the plurality of electrical contacts; and
the electrical signal source; and
a memory unit communicatively coupled to the processing circuitry, wherein the processing circuitry is further configured to save, to the memory unit, the indication of the determination of whether the tested material includes the defect.

3. The system of claim 1, wherein the respective measurement electrical parameters, the corresponding respective first control electrical parameters, and the corresponding respective second control electrical parameters comprise at least one of respective voltage values or respective electrical impedance values.

4. The system of claim 1, wherein the electrical signal comprises a voltage signal or a current signal.

5. The system of claim 1, wherein the tested material comprises a ceramic.

6. The system of claim 1, wherein the tested material comprises a multilayer material comprising at least one layer constructed of a ceramic.

7. The system of claim 1, wherein the defect comprises a crack in the tested material.

8. A non-transitory computer readable storage medium encoded with instructions for verifying structural integrity of a tested material that comprises at least one of an electrically conductive material or an electrically semiconductive material that, when executed, cause one or more processors of a computing device to:

control, via interface hardware of the computing device, a switch network to designate one or more measurement electrical contacts from a plurality of electrical contacts, each of the one or more measurement electrical contacts being electrically coupled to the tested material and communicatively coupled to the computing device;

control, via the interface hardware, an electrical signal source to output an electrical signal through an inductor to the tested material, wherein the inductor is electrically coupled to the tested material;

receive, via the interface hardware and from the one or more measurement electrical contacts that are electrically coupled to the tested material, one or more electrical parameters of the tested material while the electrical signal output by the electrical signal source is conducted through the tested material;

determine a temperature-scaled control data set based on a measurement temperature (Tm) associated with a measurement data set (Dm) that comprises a plurality of values representative of the one or more electrical parameters of the tested material at the measurement temperature (Tm) at least in part by:

determining the measurement temperature (Tm), a first control data set (Dc1) associated with a first control temperature, a second control data set (Dc2) associated with a second control temperature, the first control temperature (Tc1), and the second control temperature (Tc2); and determining a weighted sum of the first control data set and the second control data set based on a scaling factor (F), the first control data set, and the second control data set; and wherein the scaling factor (F) is (i) a linear combination based on the measurement temperature according to $$F = \frac{|T_m - T_{c1}|}{T_{c2} - T_{c1}} \text{ or}$$

(ii) a polynomial combination based on the measurement temperature, the first control temperature, and the second control temperature according to $$F = A*T_m^2 + B*T_m + C,$$

where each of A, B, and C represents a respective experimentally derived constant determined by fitting a polynomial curve to experimental data of conductivity of the tested material versus temperature;

generate comparisons of respective values of the measurement data set to corresponding respective values of the temperature-scaled control data set (Dts);

determine whether the tested material includes a defect based on the comparisons; and output, via the interface hardware, an indication of the determination of whether the tested material includes the defect.

9. The non-transitory computer readable storage medium of claim 8, wherein the defect comprises a crack in the tested material.

10. The non-transitory computer readable storage medium of claim 8, wherein the respective measurement electrical parameters, the corresponding respective first control electrical parameters, and the corresponding respective second control electrical parameters comprise at least one of respective voltage values or respective electrical impedance values.

11. The non-transitory computer readable storage medium of claim 8, wherein the electrical signal comprises a voltage signal or a current signal.

12. The non-transitory computer readable storage medium of claim 8, wherein the tested material comprises a multilayer material comprising at least one layer constructed of a ceramic.

* * * * *